(12) United States Patent
Patel et al.

(10) Patent No.: US 10,038,138 B1
(45) Date of Patent: Jul. 31, 2018

(54) HIGH TEMPERATURE VOLATILIZATION OF SIDEWALL MATERIALS FROM PATTERNED MAGNETIC TUNNEL JUNCTIONS

(71) Applicant: Headway Technologies, Inc., Milpitas, CA (US)

(72) Inventors: Sahil Patel, Fremont, CA (US); Yu-Jen Wang, San Jose, CA (US); Dongna Shen, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/728,839

(22) Filed: Oct. 10, 2017

(51) Int. Cl.
*H01L 43/12* (2006.01)
*H01L 43/10* (2006.01)
*H01L 43/08* (2006.01)
*H01L 41/47* (2013.01)
*H01L 43/02* (2006.01)

(52) U.S. Cl.
CPC .............. *H01L 43/12* (2013.01); *H01L 43/02* (2013.01); *H01L 43/08* (2013.01); *H01L 43/10* (2013.01)

(58) Field of Classification Search
CPC ......... H01L 43/08; H01L 43/10; H01L 43/12; H01L 41/47
See application file for complete search history.

(56) References Cited

U.S. PATENT DOCUMENTS

| | | | |
|---|---|---|---|
| 6,806,096 B1 | 10/2004 | Kim et al. | |
| 6,984,529 B2 | 1/2006 | Stojakavic et al. | |
| 7,001,783 B2 | 2/2006 | Costrini et al. | |
| 7,009,266 B2 | 3/2006 | Shi et al. | |
| 7,060,194 B2 | 6/2006 | Kodaira et al. | |
| 7,696,551 B2 | 4/2010 | Xiao et al. | |
| 7,978,442 B2 | 7/2011 | Zhang et al. | |
| 8,008,097 B2 | 8/2011 | Parkin | |

(Continued)

OTHER PUBLICATIONS

"Microwave Assisted Magnetic Recording," by Jian-Gang Zhu, et al., IEEE Transactions on Magnetics, vol. 44, No. 1, Jan. 2008, pp. 125-131.

(Continued)

*Primary Examiner* — Christine Enad
(74) *Attorney, Agent, or Firm* — Saile Ackerman LLC; Stephen B. Ackerman (57) ABSTRACT

A process flow for forming and encapsulating magnetic tunnel junction (MTJ) nanopillars is disclosed wherein MTJ layers including a reference layer (RL), free layer (FL), and tunnel barrier layer (TB) are first patterned by reactive ion etching or ion beam etching to form MTJ sidewalls. A plurality of MTJs on a substrate is heated (annealed) at a station in a process chamber to substantially crystallize the RL, FL, and TB to a body centered cubic (bcc) structure without recrystallization from the edge of the device before an encapsulation layer is deposited thereby ensuring lattice matching between the RL and TB, and between the FL and TB. The encapsulation layer is deposited at the same station as the anneal step without breaking vacuum, and preferably using a physical vapor deposition to prevent reactive species from attacking MTJ sidewalls. Magnetoresistive ratio is improved especially for MTJs with critical dimensions below 70 nm.

20 Claims, 4 Drawing Sheets

(56) References Cited

U.S. PATENT DOCUMENTS

| | | |
|---|---|---|
| 8,203,389 B1 | 6/2012 | Zhou et al. |
| 8,270,112 B2 | 9/2012 | Funayama et al. |
| 8,455,965 B2 | 6/2013 | Li et al. |
| 8,462,461 B2 | 6/2013 | Braganca et al. |
| 8,482,966 B2 | 7/2013 | Kang et al. |
| 8,582,240 B1 | 11/2013 | Chen et al. |
| 8,604,886 B2 | 12/2013 | Nikonov et al. |
| 8,634,163 B2 | 1/2014 | Tanabe et al. |
| 8,722,543 B2 | 5/2014 | Bolen et al. |
| 9,081,669 B2 | 7/2015 | Tadepalli et al. |
| 9,166,154 B2 | 10/2015 | Satoh et al. |
| 9,230,571 B1 | 1/2016 | Chen et al. |
| 9,269,894 B2 | 2/2016 | Mudivarthi et al. |
| 9,275,713 B2 | 3/2016 | Guo |
| 9,281,168 B2 | 3/2016 | Mudivarthi et al. |
| 9,324,937 B1 | 4/2016 | Annunziata et al. |
| 9,362,490 B1 | 6/2016 | Xiao |
| 9,373,500 B2 | 6/2016 | Swaminathan et al. |
| 2003/0073251 A1 | 4/2003 | Ning |
| 2005/0277207 A1 | 12/2005 | Costrini et al. |
| 2007/0215911 A1 | 9/2007 | Torng et al. |
| 2009/0078927 A1 | 3/2009 | Xiao et al. |
| 2009/0159563 A1 | 6/2009 | Jung |
| 2009/0261437 A1 | 10/2009 | Kang et al. |
| 2011/0121417 A1* | 5/2011 | Li ............ H01L 43/12 257/421 |
| 2012/0028373 A1* | 2/2012 | Belen ......... H01L 43/12 438/3 |
| 2012/0292723 A1 | 11/2012 | Luo et al. |
| 2012/0299620 A1 | 11/2012 | Apalkov et al. |
| 2014/0197504 A1* | 7/2014 | Moriyama ...... G11C 11/161 257/421 |
| 2014/0227804 A1* | 8/2014 | Hsu ............. H01L 43/12 438/3 |
| 2015/0069542 A1* | 3/2015 | Nagamine ...... H01L 43/08 257/421 |
| 2016/0308112 A1* | 10/2016 | Tan ............. H01L 41/47 |
| 2016/0372658 A1 | 12/2016 | Hu et al. |
| 2017/0025602 A1 | 1/2017 | Liu et al. |
| 2018/0019387 A1* | 1/2018 | Tan ............. H01L 41/47 |

OTHER PUBLICATIONS

"Spin-Torque Oscillator Based on Magnetic Tunnel Junction with a Perpendicularly Magnetized Free Layer and In-Plane Magnetized Polarizer," by Hitoshi Kubota, et al., 2013 The Japan Society of Applied Physics, Applied Physics Express 6 (2013) 103003, Sep. 27, 2013, pp. 1-3.

"High-Power Coherent Microwave Emission from Magnetic Tunnel Junction Nano-oscillators with Perpendicular Anisotropy," by Zhongming Zeng, et al, 2012 American Chemical Society, Jun. 4, 2012, vol. 6, No. 7, pp. 6115-6121.

"Current-driven excitation of magnetic multilayers," by J.C. Slonczweski, Journal of Magnetism and Mangetic Materials, vol. 159, Issues 1-2, Jun. 1996, pp. L1-L7.

\* cited by examiner

HIGH TEMPERATURE VOLATILIZATION OF SIDEWALL MATERIALS FROM PATTERNED MAGNETIC TUNNEL JUNCTIONS

RELATED PATENT APPLICATIONS

This application is related to U.S. application Ser. No. 15/463,113, filing date Mar. 20, 2017; U.S. application Ser. No. 15/479,572, filing date Apr. 5, 2017; and Ser. No. 15/595,484, filing date May 15, 2017; assigned to a common assignee and herein incorporated by reference in their entirety.

TECHNICAL FIELD

The present disclosure relates to a method of improving the magnetoresistive ratio for magnetic tunnel junctions (MTJs) in memory devices, and in particular to a high temperature process for removing volatile residue from MTJ sidewalls and crystallizing the ferromagnetic electrodes that may be performed in the same process chamber used to deposit an encapsulation layer that is employed to fill the gaps between adjacent MTJs.

BACKGROUND

Perpendicularly magnetized magnetic tunnel junctions (p-MTJs) are a major emerging technology for use in embedded magnetic random access memory (MRAM) applications, and in standalone MRAM applications. STT-MRAM is a p-MTJ technology using spin-torque for writing of memory bits that was described by C. Slonezewski in "Current driven excitation of magnetic multilayers", J. Magn. Magn. Mater. V 159, L1-L7 (1996). P-MTJ technologies are highly competitive with existing semiconductor memory technologies such as SRAM, DRAM, and flash.

P-MTJs have a general structure wherein an insulating tunnel barrier is sandwiched between two magnetic layers. One of the magnetic layers is called the reference layer and has a magnetization fixed in an out-of-plane direction in the (+y) direction, for example, when the plane of the magnetic layer is formed along the x-axis and z-axis directions. The second magnetic layer called the free layer also has an out-of-plane magnetization with a direction that is free to be either parallel in a (+y) direction (P state) or anti-parallel in a (−y) direction (AP state). The difference in resistance between the P state (Rp) and AP state (Rap) can be characterized by the equation (Rap-Rp)/Rp that is also known as DRR or the magnetoresistive (MR) ratio. It is important for p-MTJ devices to have a large DRR value since this property is directly related to the read margin for the memory bit, or the ease of differentiating between the P state and AP state (0 or 1 bits).

To compete with high speed embedded RAM technologies, patterned p-MTJs in the form of nanopillars must be fabricated into high density arrays with single bits that can be written at high speed (<100 ns) at low writing currents. An encapsulation layer made of a dielectric material is typically deposited to fill gaps between adjacent p-MTJ nanopillars to electrically insulate the devices. To achieve the goal of low writing currents, total volume "V" in the free layer must be reduced, which is most easily achieved by reducing the physical dimensions of the p-MTJ. One or both of the x-axis and z-axis dimensions may be reduced when a thickness of each p-MTJ layer is in the y-axis direction. Moreover, the thickness of the free layer may be reduced to shrink V. However, as the physical dimensions decrease, the effect of current conductance through "edge" or sidewall regions of the p-MTJ nanopillar becomes more pronounced. These edge regions are of particular importance as crystal structure damage from etching, encapsulation, and annealing processes may greatly affect critical device properties such as free layer coercivity (Hc), DRR, and resistance-area product (RA).

For embedded MRAM designs, p-MTJ devices are subject to 400° C. annealing for a plurality of hours due to Complementary Metal Oxide Semiconductor (CMOS) back-end-of-line (BEOL) processes. Therefore, thermal stability of the encapsulation layer/p-MTJ interface is of extreme importance, especially for devices with a critical dimension proximate to 100 nm or less. Furthermore, a process flow for etching MTJ sidewalls is desired that substantially reduces sidewall damage for devices with a diameter or critical dimension (CD) around 45 nm or less where a significant portion of device current flows near the encapsulation layer/p-MTJ interface. This interface may be modified by exposure to reactive species during etching to form the p-MTJ sidewalls, and during deposition of the encapsulation layer. Furthermore, any process steps performed between p-MTJ etching and encapsulation may influence the integrity of the p-MTJ sidewalls, as well as the crystal structure and chemical composition of films that constitute the p-MTJ nanopillar thereby enhancing or degrading overall p-MTJ bit performance.

In order for p-MTJs to be more competitive with competing memory technologies, DRR must be substantially improved while maintaining the other critical device properties during BEOL processing.

SUMMARY

One objective of the present disclosure is to provide a process flow from p-MTJ etching through formation of an encapsulation layer adjoining p-MTJ sidewalls that enhances DRR while maintaining other critical p-MTJ properties in memory devices including MRAM and STT-MRAM.

A second objective of the present disclosure is to perform the process flow of the first objective with tools and methods that are compatible with fabrication of p-MTJ nanopillars having critical dimensions proximate to 100 nm or less.

According to a preferred embodiment, these objectives are achieved with a process flow wherein an MTJ stack of layers is patterned to form a plurality of MTJ nanopillars each having a sidewall that stops on a substrate such as a bottom electrode, and then a high temperature anneal step and encapsulation step are sequentially performed at the same station in a process chamber without breaking a vacuum. The MTJ stack has at least a reference layer, free layer, and a tunnel barrier between the free layer and reference layer, and an uppermost layer that may be a hard mask. In preferred embodiments, the free layer (FL) and reference layer (RL) each comprise an amorphous CoFeB layer adjoining an amorphous MgO tunnel barrier. The anneal comprises a vacuum of less than $1 \times 10^{-7}$ Torr and a temperature between 250° C. and 350° C., and may be of sufficient duration to enable a substantial portion of the free layer, reference layer, and tunnel barrier to crystallize to a lattice matching structure before the encapsulation process fills the gaps between adjacent MTJ sidewalls. For example, a body centered cubic (bcc) crystal structure may be formed in each of the RL and FL due to recrystallization of the RL and FL from the tunnel barrier interface in order to promote a larger DRR value. In the preferred embodiment with RL and FL containing CoFeB and the tunnel barrier comprised of MgO, the (001) texture of the rock-salt MgO layer serves as a template to recrystallize adjoining CoFeB layers forming a coherent interface between the RL and the tunnel barrier, and between the tunnel barrier and the FL crystals. As a result of this anneal step after etching and prior to encapsulation, crystal growth in the MTJ nanopillar is not influenced by the crystal structure in the subsequently deposited encapsulation layer thereby ensuring coherent lattice structure between the RL and tunnel barrier, and between the FL and tunnel barrier.

In some embodiments, the annealing and encapsulation steps are performed on a heated electrostatic chuck with backside Ar gas pressure to improve the heating rate and uniformity on the substrate. Here, the annealing step may be considered to be a first part of an encapsulation process since both of the annealing and subsequent dielectric layer deposition on MTJ sidewalls are performed in the same chamber with no intervening step. In preferred embodiments, the encapsulation step to form a dielectric layer adjoining MTJ sidewalls is accomplished with a physical vapor deposition (PVD) method to avoid attack on MTJ sidewalls that tends to occur with reactive species generated by a PECVD or CVD method. The encapsulation temperature may be between 250° C. and 400° C., and the annealing step prior to encapsulation has sufficient duration to allow crystallization of the RL and FL and to improve tunnel barrier crystallinity before the encapsulation layer is deposited.

In one embodiment, the MTJ stack is patterned by a reactive ion etch (RIE) process using an overlying hard mask pattern to protect unexposed portions of the MTJ stack. There may be a sputter etch following the RIE to remove damaged portions of MTJ sidewall before the anneal step. In an alternative embodiment, an ion beam etch (IBE) is employed to transfer a pattern in a hard mask through the MTJ stack to form MTJ sidewalls.

In some embodiments, encapsulation of the MTJ nanopillars includes a first step comprising PVD to form a first encapsulation layer with a thickness of 20 to 200 Angstroms that adjoins the MTJ sidewalls, and a second deposition step to form a second encapsulation layer with a thickness up to 2000 Angstroms that completely fill the gaps between adjacent MTJs. The second deposition step may involve CVD or PECVD that has better gap filling capability than PVD. Once the encapsulation process is finished, a chemical mechanical polish (CMP) process is generally performed to remove all layers above the hard mask thereby forming a MTJ nanopillar top surface that is coplanar with the surrounding one or more encapsulation layers. From a top-down view, the MTJ nanopillars are configured in rows and columns, and appear as circular or elliptical shapes, for example.

DETAILED DESCRIPTION

The present disclosure provides a process flow for etching a MTJ stack of layers to form a MTJ nanopillar, performing a high temperature anneal, and encapsulating the MTJ nanopillars such that DRR is substantially improved compared with conventional process flows. Although only one MTJ nanopillar is depicted in the drawings with cross-sectional views, one skilled in the art appreciates that a plurality of MTJ nanopillars is formed in an array of rows and columns in a typical memory device pattern. A process is defined as a method that includes one or more steps, and a process flow according to the present disclosure refers to two or more processes in succession. Thus, a MTJ etch process to form a MTJ nanopillar may comprise multiple etch steps. Moreover, an encapsulation process that fills gaps between adjacent MTJ nanopillars may include a plurality of steps including annealing, and depositing one or more dielectric layers at a single station in a process chamber. The MTJ nanopillars may be formed in memory devices including MRAM and STT-MRAM, or in spintronic devices such as a spin torque oscillator (STO), magnetic sensors, and biosensors.

In related patent application Ser. No. 15/595,484, we disclosed a volatilization treatment at 50° C. to 450° C. between a MTJ etch process and encapsulation that was useful in removing residue from MTJ sidewalls. Conversion of a non-volatile metal residue to a volatile form with a chemical treatment was preferably accomplished before the volatilization treatment. Now we have discovered that incorporating an anneal step into an encapsulation process following MTJ etch provides a continuous process flow without breaking a vacuum in the encapsulation process chamber and thereby enables further improvement in DRR for MTJ nanopillars. Performing the annealing step and encapsulation step in the same process chamber, without breaking vacuum, is critical, as it prevents the exposure of the naked MTJ sidewall to reactive gases present in the atmosphere, such as water and oxygen.

Figure 1:
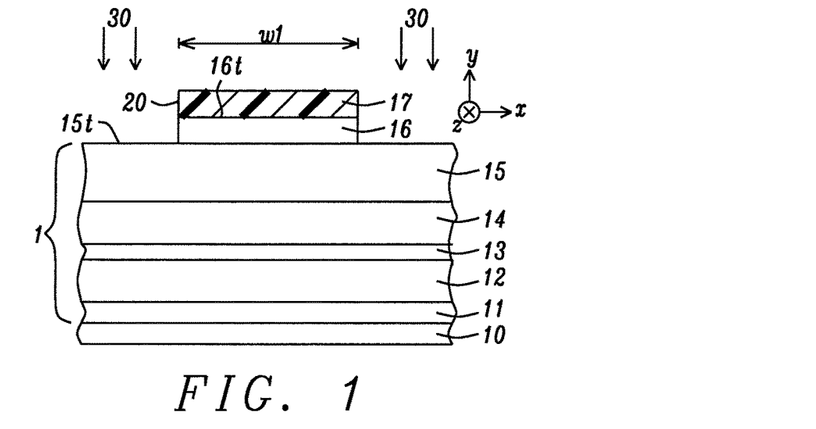
FIG. 1 is a cross-sectional view of a p-MTJ stack of layers on which a photoresist pattern has been formed, and shows ions used to transfer the pattern through an underlying BARC or DARC during an etch sequence according to an embodiment of the present disclosure.

Referring to FIG. 1, a MTJ stack of layers 1 that will eventually become a MTJ nanopillar in a MRAM or STT-MRAM is shown from a cross-sectional view. The y-axis is perpendicular to the planes of the layers in the MTJ stack. There is a substrate 10 that in one embodiment is a bottom electrode in a memory device. The bottom electrode may be a multilayer structure and is typically embedded in a dielectric layer (not shown). It should be understood that the present disclosure encompasses all MTJ configurations and is not limited to the MTJ stack shown herein.

MTJ stack 1 is deposited on the substrate 10 and in the exemplary embodiment has a bottom spin valve configuration wherein an optional seed layer 11, reference layer 12, tunnel barrier 13, free layer 14, and hard mask 15 are sequentially formed on the substrate. Each of the reference layer and free layer preferably have PMA with a magnetization aligned in a positive or negative y-axis direction. In other embodiments, at least one additional layer may be included in the aforementioned MTJ stack such as a Hk enhancing layer between the free layer and hard mask that enhances PMA in the free layer (FL) by introducing an additional FL/metal oxide interface. The seed layer may be comprised of one or more of NiCr, Ta, Ru, Ti, TaN, Cu, Mg, or other materials typically employed to promote a smooth and uniform grain structure in overlying layers.

The reference layer 12 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB may be inserted between the uppermost layer in the laminated stack and the tunnel barrier layer to provide a CoFeB interface with the tunnel barrier layer thereby enhancing DRR for MTJ 1.

The tunnel barrier layer 13 is preferably a metal oxide that is one of MgO, TiOx, AlTiO, MgZnO, $Al_2O_3$, ZnO, ZrOx, HfOx, MgAlO, or MgTaO. More preferably, MgO is selected as the tunnel barrier layer because MgO provides the highest magnetoresistive ratio (DRR), especially when sandwiched between two CoFeB layers, for example. It is believed that high DRR is achieved with a CoFeB/MgO/CoFeB RF/tunnel barrier/FL stack because of lattice matching wherein each of the aforementioned layers grow a bcc structure with a (001) orientation, for example, when crystal growth from an amorphous state is not interrupted by factors favoring a different crystal structure. Moreover, DRR is enhanced by the well-known spin filtering effect of MgO tunnel barriers.

The free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta, W, Mo, Ti, Al, or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

The hard mask 15 is also referred to as a capping layer and is typically comprised of one or more of Ta, Ru, TaN, Ti, TiN, and W. It should be understood that other hard mask materials including MnPt may be selected in order to provide high etch selectivity relative to underlying MTJ layers during an etch process that forms MTJ nanopillars with sidewalls that stop on the bottom electrode. All layers in the MTJ stack may be deposited in a DC sputtering chamber of a sputtering system such as an Anelva C-7100 sputter deposition system that includes ultra-high vacuum DC magnetron sputter chambers with multiple targets and at least one oxidation chamber. Usually, the sputter deposition process involves an argon sputter gas and a base pressure between $5 \times 10^{-8}$ and $1 \times 10^{-9}$ torr.

Once all of the layers 11-15 are deposited, a conventional process is used to pattern MTJ stack 1. According to one embodiment of the present disclosure, a bottom antireflective coating (BARC) or dielectric antireflective coating (DARC) layer 16, and a photoresist layer 17 are sequentially coated on the top surface 15t of the hard mask. BARC or DARC with top surface 16t has a refractive index that minimizes reflection of light during the subsequent patternwise exposure of the photoresist layer thereby enabling more uniform island shapes with less CD variation to be formed in the photoresist layer. Next, a conventional patternwise exposure and developer sequence is employed to form a pattern in the photoresist layer that comprises a plurality of islands each with sidewall 20. As indicated later by a top-down view in FIG. 6, the islands are in an array with a plurality of rows and columns. However, only one island is shown in FIG. 1 in order to simplify the drawing. Each island has a critical dimension w1 that in some embodiments is between 45 nm and 100 nm, and in other embodiments may approach 30 nm or less that corresponds to the CD required in state of the art memory devices. Note that some devices are circular such that w1 is formed in both of the x-axis and z-axis directions. However, the top-down shape of island 17 may be an ellipse or a polygon such that the z-axis dimension is different from the x-axis dimension.

In one embodiment, the etch process employed to pattern MTJ stack 1 comprises a plurality of etch steps. During the initial etch step 30, an IBE with a noble gas that is one or more of Ar, Kr, Xe, or Ne is used to transfer the pattern in the photoresist layer through the BARC or DARC layer 16 thereby reproducing the shape of island 17 in the underlying layer. However, the first etch step may be a RIE (instead of IBE) that comprises a fluorocarbon or chlorocarbon gas to transfer the island shape in photoresist layer 17 through the BARC or DARC layer 16. Accordingly, sidewall 20 is formed and extends from a top surface of the photoresist layer to a top surface 15t of the hard mask 15, and CD w1 is duplicated in the DARC or BARC layer. The photoresist layer may then be removed with a well known method, or is etched away during subsequent etch processes.

Figure 2:
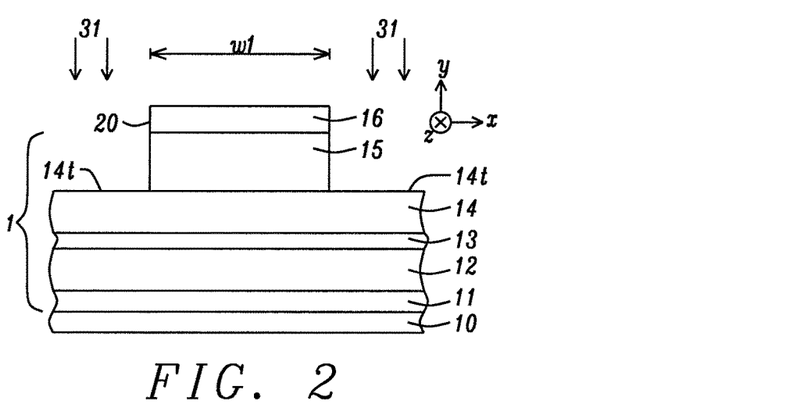
FIG. 2 is a cross-sectional view of the p-MTJ stack in FIG. 1 after an etch process transfers the pattern through the uppermost hard mask p-MTJ layer according to an embodiment of the present disclosure.

Referring to FIG. 2, a second etch step 31 is performed to transfer the island shape with sidewall 20 and CD w1 through the hard mask 15. In some embodiments, a second IBE with a noble gas, or a second fluorocarbon or chlorocarbon based RIE may be used. However, in other embodiments, the present disclosure anticipates that the conditions employed for etch step 31 are essentially the same as applied in etch step 30 such that the etch transfer through the hard mask may be a continuation of the etch transfer through DARC or BARC layer 16. In other words, etch step 30 in FIG. 1 may be continued until stopping on top surface 14t of the free layer. As mentioned earlier, etching through the hard mask is likely to remove any remaining photoresist layer 17 because the etch rate through the latter is generally high relative to that of the hard mask, and the hard mask may be substantially thicker than the remaining photoresist layer once etch step 30 clears the exposed DARC or BARC layer 16.

Figure 3:
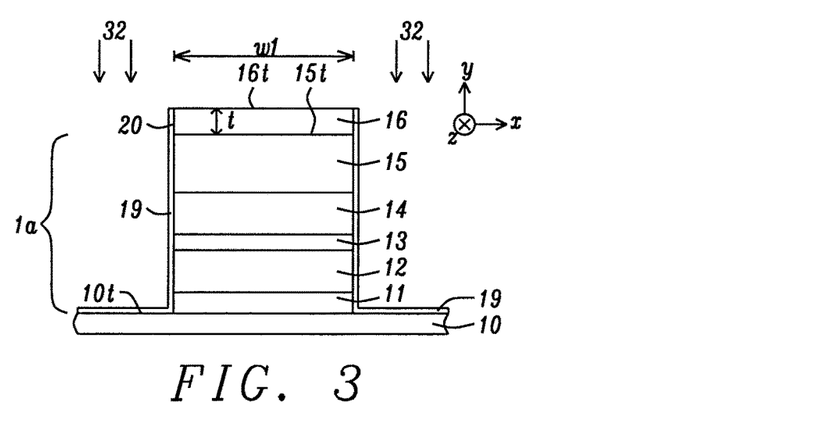
FIG. 3 is cross-sectional view of a p-MTJ nanopillar after an etch process transfers the hard mask pattern through the remaining p-MTJ stack according to an embodiment described herein.

Referring to FIG. 3, the etch process of the present disclosure continues with etch step 32 that effectively transfers the island shape in the hard mask through all of the underlying MTJ layers 11-14 thereby forming MTJ nanopillar 1a. Etch step 32 may comprise IBE conditions or RIE conditions, or a combination of RIE and IBE hereinafter referred to as RIBE. Thus, IBE is considered to include a physical component represented by noble gas ions such as Ar ions, and RIE is based on a chemical component comprising ions of a chemical species that are generated by applying RF power to sustain a plasma. Moreover, RIBE comprises both of a noble gas and one or more chemicals including methanol, ethanol, $NH_3$, and CO which are fed into an etch chamber while a plasma is induced with a RF power at a temperature usually proximate to room temperature. Preferably, ions in etch step 32 are directed perpendicular to the top surface of the substrate along the y-axis direction to avoid a horizontal component that could reduce the CD significantly below w1. As a result, sidewall 20 is a continuous surface extending from a top surface 15t of hard mask 15 to top surface 10t of the bottom electrode.

In a preferred embodiment, the sidewall 20 is substantially vertical such that CD w1 is established in all MTJ layers 11-15. However, in other embodiments, the sidewall may be non-vertical such that layers 11-15 have an increasing width (greater than w1) with increasing distance from top surface 16t. In the exemplary embodiment, a thickness t of the DARC or BARC layer remains after the etch transfer. However, depending on the initial thickness and composition of layer 16, and the etch conditions, the DARC or BARC layer may be completely removed during etch step 32 such that hard mask top surface 15t is exposed. Therefore, a hard mask 15 is advantageously selected that has a high etch rate selectivity to the underlying MTJ layers so that a substantial thickness of hard mask remains after etch step 32. When IBE is selected for etch step 32, a certain amount of etch residue may be deposited to form a coating 19 on sidewall 20. Although RIE generally minimizes deposition of residue on MTJ sidewalls, reactive species produced in the RIE plasma may attack the MTJ layers and tend to damage the sidewalls. The choice of IBE, RIE, or RIBE usually depends in part on the composition of the MTJ layers, which in turn determines etch rate selectively compared with the hard mask. In some cases, RIE and RIBE conditions may be optimized to minimize sidewall damage, or a sputter clean step may follow RIE to remove damaged portions of MTJ sidewall before subsequent steps are performed.

The process flow of the present disclosure comprises an encapsulation process following formation of the MTJ nanopillar 1a. According to one embodiment, the substrate with a plurality of MTJ nanopillars is removed from the MTJ etch process chamber, exposed to the atmosphere, and transferred to a second process chamber that may be in a different mainframe. However, the present disclosure also anticipates an embodiment in which the MTJ etch and encapsulation processes are performed in the same vacuum system under high vacuum conditions so that exposure to the atmosphere is avoided between MTJ etch and encapsulation.

Figure 4:
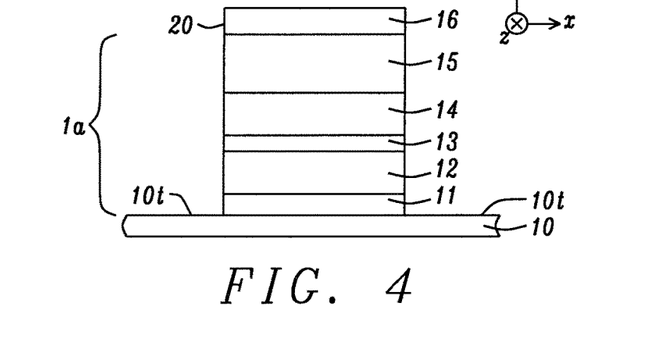
FIG. 4 is a cross-sectional view of the p-MTJ nanopillar in FIG. 3 after an annealing step is performed on a heated electrostatic chuck according to an embodiment of the present disclosure.

Referring to FIG. 4, the encapsulation process of the present disclosure comprises a first step wherein the substrate with the MTJ nanopillar array is loaded in a process chamber that may have one or a plurality of stations, and each station may have an electrostatic chuck to hold the substrate in place for the duration of the process. According to one embodiment, the electrostatic chuck (not shown) that is employed for the encapsulation process is heated and has backside pressure control with an inert gas such as Ar to provide a more uniform heating rate and more uniform heating across the substrate, which may have a diameter of 300 mm or more.

As indicated in FIG. 3, residue 19 may be formed on sidewall 20 and on substrate top surface 10t surrounding the MTJ nanopillar as a result of etch process 32. According to FIG. 4, a key feature of the encapsulation process of the present disclosure is an anneal step that is performed at a station with a heated electrostatic chuck as described previously. According to one embodiment, the anneal step comprises loading the wafer on the electrostatic chuck at room temperature (RT) and then ramping up the temperature to temperature (t1) in the range of 250° C. to 400° C. over a first period of time that is a plurality of minutes. Moreover, a vacuum is applied to the process chamber to provide a pressure therein which is less than $1 \times 10^{-7}$ Torr. Accordingly, residue and any moisture on sidewall 20 is removed because the combination of high temperature and high vacuum conditions. For example, polymer and chemical residues resulting from the etch process may be removed via evaporation.

A critical aspect of the anneal step is setting the first period time and temperature such that a substantial portion of the free layer, reference layer, and tunnel barrier in MTJ nanopillar 1a crystallizes to a bcc structure for the free and reference layer, and a rock salt crystal structure for the MgO tunnel barrier, thereby forming a coherent crystal structure between the RL and tunnel barrier, and between the FL and tunnel barrier. Otherwise, deposition of an encapsulation layer prior to anneal would enable the crystal structure or amorphous character in the encapsulation layer to influence crystal growth in adjoining MTJ layers. In particular, the encapsulation layer crystal structure could be different than bcc and thereby disrupt the desired crystal growth in one or more of the FL, RL, and tunnel barrier, and prevent lattice matching (coherent crystal structure) required for optimum DRR.

In some embodiments, the anneal step is continued for a second period of time immediately following the first period of time at temperature (t1), or by ramping up from t1 to a temperature (t2) where t2>t1, and is proximate to 400° C. but less than 450° C. in order to substantially complete the FL, RL, and tunnel barrier crystallization before depositing the encapsulation layer. In all embodiments, another critical feature is to perform the subsequent encapsulation layer deposition at the same station as the anneal step. In other words, the encapsulation layer is deposited during a third period of time that immediately follows the second period of time, or begins at the end of the first period of time if the second period is omitted. Preferably, the encapsulation layer is deposited while maintaining the electrostatic chuck at the same temperature (t1) used during the first period of time, or at temperature (t2) if the anneal includes a second period after the first period. One benefit of depositing the encapsulation layer at the same station as the anneal step and not breaking vacuum in the process chamber between the aforementioned steps is to achieve greater throughput in the process flow. Secondly, MTJ sidewalls are not exposed to water vapor, oxygen, or other gases that tend to react with MTJ layers between anneal and an encapsulation step during conventional process flows.

Figure 5:
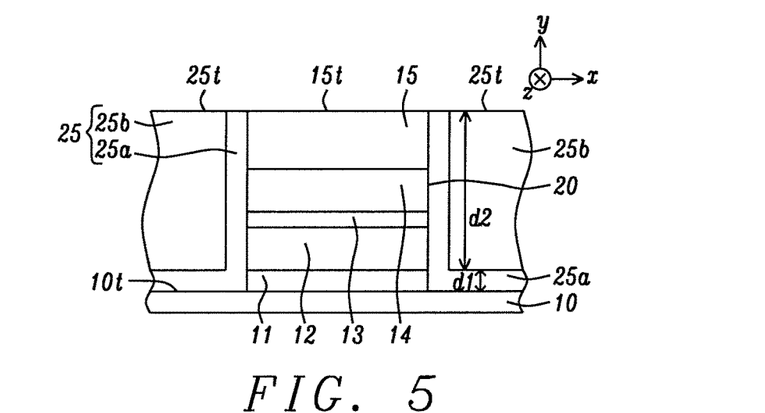
FIG. 5 is a cross-sectional view of the p-MTJ nanopillar in FIG. 4 following deposition of an encapsulation layer on the heated electrostatic chuck, and planarization to electrically isolate the p-MTJ nanopillar from adjacent MTJ nanopillars.

As depicted in FIG. 5, the next step in the encapsulation process is deposition of the encapsulation layer 25 that adjoins sidewall 20. In the exemplary embodiment, the encapsulation layer comprises more than one layer. For example, a first encapsulation layer 25a with a first thickness d1 of 20 to 200 Angstroms is preferably deposited at temperature t1 (or t2) by a physical deposition method (PVD) with RF sputtering in order to avoid reactive species from a chemical vapor deposition (CVD) or plasma enhanced CVD (PECVD) method from attacking MTJ sidewalls. Then a second encapsulation layer 25b having a thickness d2 up to 2000 Angstroms is deposited on the first encapsulation layer. Usually, a CVD or PECVD method is selected to deposit layer 25b since these techniques are known for excellent gap filling capability between adjacent MTJ nanopillars. The second encapsulation layer may be deposited at a temperature from 250° C. up to about 400° C., but preferably less than 450° C. Thereafter, a chemical mechanical polish process is employed to form a planar top surface 25t for the encapsulation layer that is coplanar with top surface 15t of the MTJ hard mask.

The first encapsulation layer 25a may be one of $SiO_YN_Z$, $AlO_YN_Z$, $TiO_YN_Z$, $SiC_YN_Z$, $TaO_YN_Z$, or MgO, or any combination of the aforementioned materials where y+z>0. In an alternative embodiment, the first encapsulation layer is comprised of one or more of B, Ge, BX, and GeX where X is one of O, N, B, C, Ge, Si, Al, P, Ga, In, Tl, Mg, Hf, Zr, Nb, V, Ti, Cr, Mo, W, Sr, and Zn. As disclosed in related patent application Ser. No. 15/463,113, formation of the first encapsulation layer may comprise a plurality of steps and produce a plurality of layers such as B/BX or Ge/GeX stacks. Also, in related application Ser. No. 15/479,572, we disclosed a first encapsulation layer composition, which is 0.1 to 10 weight % of a metal oxide in a metal nitride matrix.

The second encapsulation layer 25b is preferably one of $SiO_YN_Z$, $AlO_YN_Z$, $TiO_YN_Z$, $SiC_YN_Z$, $TaO_YN_Z$, or MgO, or any combination of the aforementioned materials where y+z>0. In alternative embodiments, the second encapsulation layer may be another metal oxide, metal carbide, metal nitride, metal oxynitride, or metal carbonitride used in the art.

Figure 6:
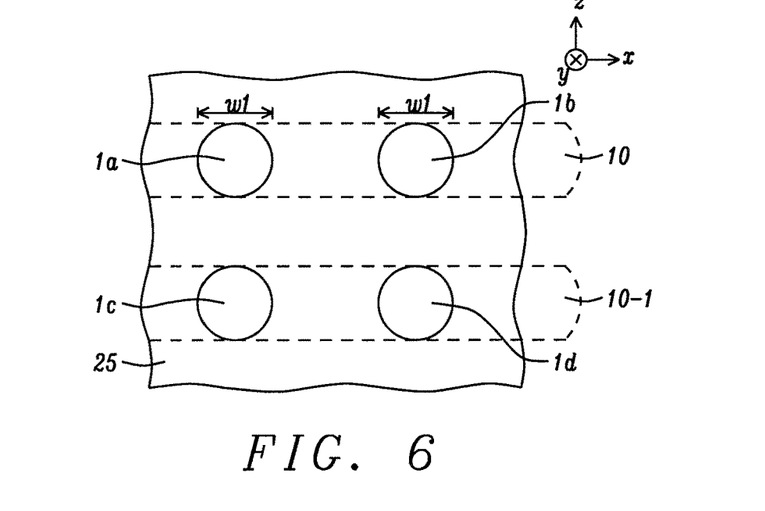
FIG. 6 is a top-down view of a plurality of p-MTJ nanopillars having a circular shape in an array of rows and columns according to one embodiment of the present disclosure.

Referring to FIG. 6, a MTJ nanopillar array from a top-down view is shown following the process flow of the present disclosure. Additional MTJ nanopillars 1b, 1c, and 1d each having critical dimension w1 are depicted to indicate a subset of the rows and columns formed in the memory structure. Thus, MTJ nanopillar 1a is shown in the same row as MTJ nanopillar 1b, and MTJ nanopillars 1c, 1d are in the same column as MTJ nanopillars 1a and 1b, respectively. As explained previously, the MTJ nanopillars are depicted with a circular shape but may have elliptical shapes in other embodiments. Generally, millions of MTJ nanopillars are formed in an array but only four are illustrated here to simplify the drawing.

Following the CMP process, a top electrode layer comprised of a plurality of parallel conductive lines (not shown) is formed by a conventional method on the MTJ nanopillars and encapsulation layer 25 as appreciated by those skilled in the art. A first top electrode line may contact a top surface 15t of MTJ nanopillars 1a, 1c while a second top electrode line contacts top surface 15t in MTJ nanopillars 1b, 1d. Conductive lines in the top electrode layer are preferably formed along the z-axis direction that is orthogonal to the conductive lines along the x-axis direction in the bottom electrode layer. Therefore, bottom electrode line 10 may contact a bottom surface of both MTJ nanopillars 1a and 1b while a second bottom electrode line 10-1 contacts the bottom surfaces of MTJ nanopillars 1c and 1d.

Figure 7:
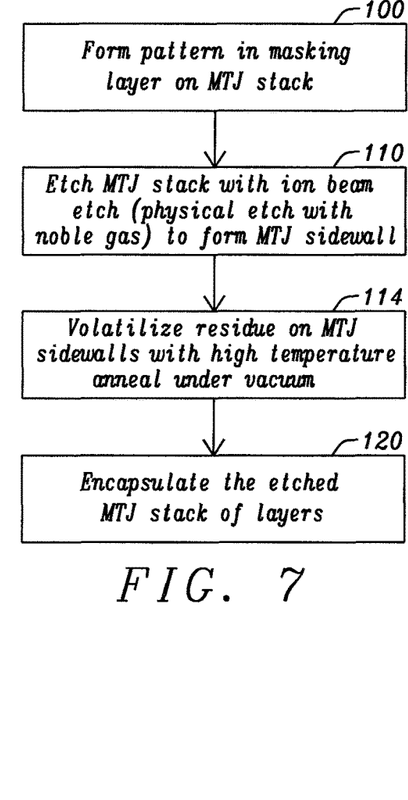
FIG. 7 is a flow diagram showing a sequence of steps of forming and encapsulating a plurality of p-MTJ nanopillars according to an embodiment of the present disclosure.

Referring to FIG. 7, a flow diagram is provided for the process flow of one embodiment of the present disclosure where a pattern with a CD is formed in the MTJ hard mask layer by an etch process 100 that comprises step 30 or both steps 30, 31 described previously. In step 110, the MTJ stack is ion beam etched according to step 32 (FIG. 3) to transfer the pattern through the remaining MTJ layers and thereby form a plurality of MTJ nanopillars. Residue on the MTJ sidewalls is removed with an anneal step 114 described previously with respect to FIG. 4. Finally, an encapsulation layer is formed around the MTJ nanopillars in step 120 to electrically isolate the MTJ nanopillars from each other. Preferably, steps 114 and 120 are performed at the same station without breaking vacuum in a process chamber as described earlier with regard to FIG. 5.

Figure 8:
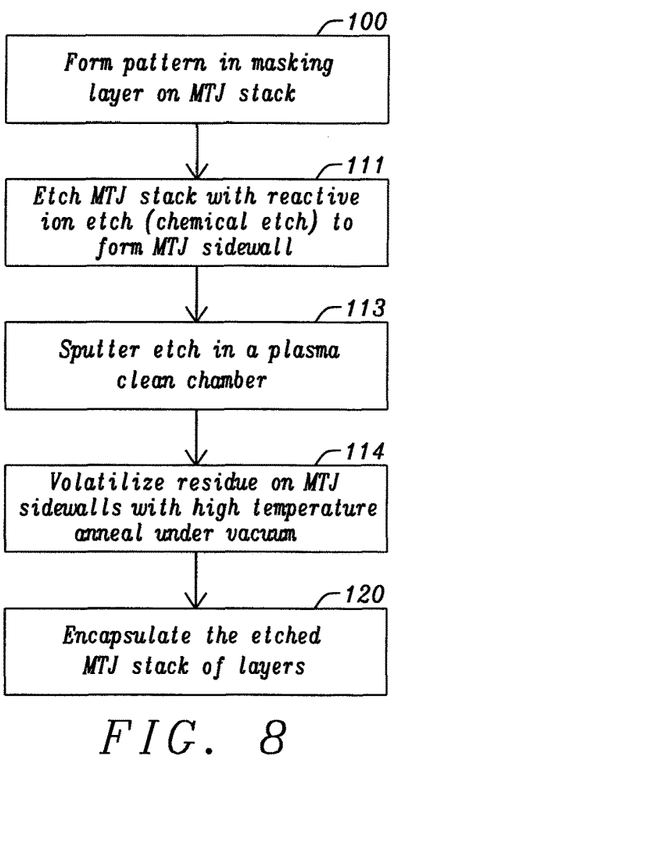
FIG. 8 is a flow diagram showing a sequence of steps of forming and encapsulating a plurality of p-MTJ nanopillars according to another embodiment of the present disclosure.

In FIG. 8, a flow diagram is depicted for the process flow of another embodiment of the present disclosure where the sequence of steps in FIG. 7 is modified by replacing an ion beam etch with step 111 that represents a reactive ion etch to form sidewall 20 on MTJ nanopillar 1a. Next, sputter etch 113 is performed in a process chamber and comprises plasma generated from a noble gas such as Ar. Preferably, sputter etching removes damaged portions of MTJ sidewall without causing a significant shrinkage in CD (w1). Subsequently, the anneal step 114 and encapsulation 120 are performed in the same process chamber. In preferred embodiments, sputter etch 113 is accomplished in the same mainframe that comprises the encapsulation process chamber.

We have demonstrated the benefits of the encapsulation process of the present disclosure with results from an experiment where a series of MTJ nanopillars with various diameters (w1 in FIG. 6) was fabricated. Each MTJ nanopillar included a hard mask, and a MgO tunnel barrier layer between a CoFeB free layer and a CoFeB reference layer. A first set of MTJ nanopillars with the same range of device sizes was fabricated by a reactive ion etch (RIE) involving methanol as the etching gas. The first set of MTJs was then sputter etched in a plasma clean chamber with a process comprising an Ar gas flow, 75 Watt wafer bias, and a working pressure of 0.52 mTorr. One half of the MTJs in the first set were removed from the sputter etch chamber, exposed to the atmosphere in the clean room, and then processed in another process chamber with a process flow that yielded reference sample A. In particular, a first encapsulation layer was sputter deposited by a PVD method at room temperature comprising 600 Watts RF power, 1.5-2 mTorr pressure, an Ar gas flow, and a silicon nitride target containing 2 weight % MgO to yield a 200 Angstrom thickness on MTJ nanopillar sidewalls. Thereafter, a 2000 Angstroms thick second encapsulation layer with a silicon nitride composition was deposited by a PECVD method at 400° C. on the first encapsulation layer to fill gaps between adjacent MTJ nanopillars. A CMP was performed and then a top electrode layer was formed on the MTJ array by a conventional process.

The other half of the first set of MTJs was processed with the same flow as in reference sample A except a high temperature anneal step was inserted after the sputter clean and before deposition of the first encapsulation layer. The anneal was performed in a process chamber by ramping the electrostatic chuck at an annealing station from room temperature to 350° C. over a period of 200 seconds while applying a backside Ar gas pressure of 7.5 Torr. The vacuum in the process chamber during annealing was $1\times10^{-7}$ Torr. Subsequently, while maintaining the substrate on the same electrostatic chuck, the silicon nitride-2 weight % MgO first encapsulation layer was deposited by PVD as before but at a temperature of 350° C. to yield sample C according to the process flow in FIG. 8. Thereafter, the second encapsulation layer and top electrode were sequentially formed as previously described.

A second set of MTJ nanopillars was prepared by etching the MTJ stack comprised of the hard mask, CoFeB free layer, MgO tunnel barrier, and CoFeB reference layer with an ion beam etch using Ar gas flow and a 200 eV beam energy. One half of the second set of MTJ nanopillars was transferred to an encapsulation process chamber where the first and second encapsulation layers were sequentially deposited by the process flow mentioned previously with respect to sample A. Following CMP and formation of a top electrode layer, reference sample B was completed.

The other half of the second set of MTJs was processed with the same flow as indicated for reference sample B except a high temperature anneal step was inserted after the ion beam etch and before deposition of the first encapsulation layer. The anneal was performed in a process chamber by ramping the electrostatic chuck at an annealing station from room temperature to 350° C. over a period of 200 seconds while applying a backside Ar gas pressure of 7.5 Torr. The vacuum in the process chamber during annealing was $1\times10^{-7}$ Torr. Subsequently, while maintaining the substrate on the same electrostatic chuck, the silicon nitride-2 weight % MgO first encapsulation layer was deposited by PVD at a temperature of 350° C. to yield sample D according to the process flow in FIG. 7. Thereafter, the second encapsulation layer and top electrode were sequentially formed as previously described.

Figure 9:
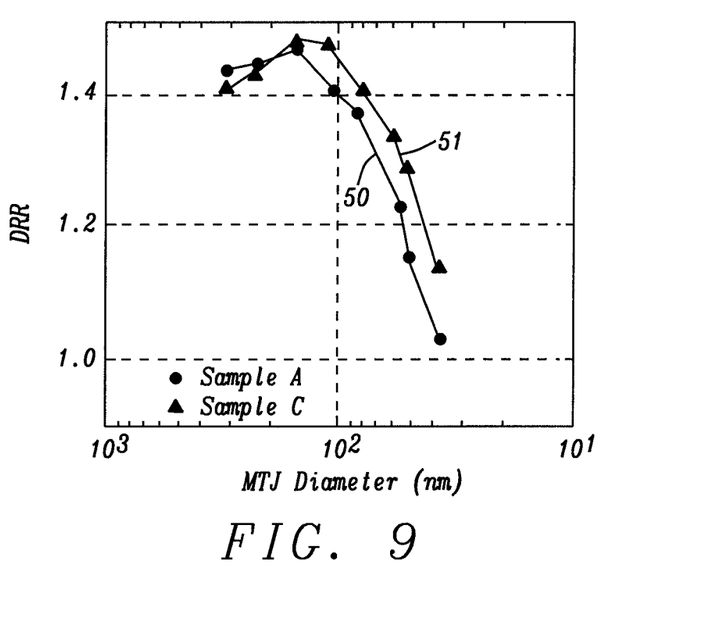
FIG. 9 is a plot of magnetoresistive ratio vs. p-MTJ size that compares p-MTJs that have been reactive ion etched and encapsulated with a conventional process flow to p-MTJs that were processed according to the process flow in FIG. 8.

FIG. 9 is a plot of magnetoresistive ratio (DRR) vs. MTJ size that compares the results from reference sample A (curve 50) to those of sample C (curve 51). Only MTJ nanopillar sizes from about 70 nm (upper left of curves) down to 30 nm (lower right of curves) are shown. Curves 50, 51 are essentially overlapping at MTJ diameters (CD) above 70 nm. We find that the encapsulation process included in the FIG. 8 process flow significantly improved DRR without degrading other MTJ properties such as Hc, or RA product, especially for MTJ nanopillars with a CD below 70 nm that is required for state of the art memory devices.

Figure 10:
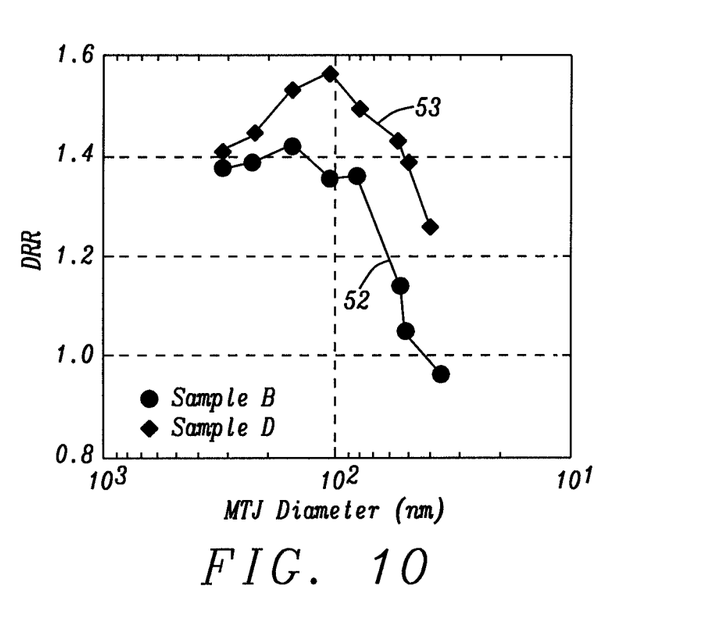
FIG. 10 is a plot of magnetoresistive ratio vs. p-MTJ size that compares p-MTJs that have been ion beam etched and encapsulated with a conventional process flow to p-MTJs that were processed according to the process flow in FIG. 7.

In FIG. 10, there is a plot of magnetoresistive ratio (DRR) vs. MTJ size that compares the results from reference sample B (curve 52) to those of sample D (curve 53). Again, only MTJ nanopillar sizes from about 70 nm (upper left of curves) down to 30 nm (lower right of curves) are shown. We find that the encapsulation process following ion beam etching in the FIG. 7 process flow offers a significant DRR improvement of >0.2 for devices less than 70 nm in diameter. No degradation in other MTJ properties was observed for sample D vs. reference sample B.

In summary, the present disclosure provides a process flow for removal of unwanted residue from MTJ sidewalls following etching, crystallization of the critical magnetic layers and tunnel barriers, including CoFeB and MgO, and the prevention of reactive chemical species from attacking the MTJ sidewalls during an encapsulation process that includes annealing and depositing one or more encapsulation layers. The process flow is effective for memory devices with a critical dimension below 70 nm. Furthermore, the benefits described herein are maintained even after a plurality of hours where the substrate is exposed to temperatures proximate to 400° C. during CMOS BEOL fabrication.

While this disclosure has been particularly shown and described with reference to, the preferred embodiment thereof, it will be understood by those skilled in the art that various changes in form and details may be made without departing from the spirit and scope of this disclosure.

We claim:

1. A process flow for fabricating magnetic tunnel junction (MTJ) nanopillars, comprising:
    (a) providing a MTJ stack of layers on a substrate wherein the MTJ stack of layers comprises a reference layer, a free layer, and a tunnel barrier layer between the reference layer and free layer;
    (b) patterning the MTJ stack with one or both of a reactive ion etch (RIE) and an ion beam etch (IBE) to form a plurality of MTJ nanopillars each having a sidewall that extends from a top surface thereof to a top surface of the substrate, and wherein adjacent MTJ nanopillars are separated by a gap;
    (c) performing a sputter clean etch of the MTJ nanopillar sidewalls comprising a plasma of a noble gas in a first process chamber; and
    (d) performing an encapsulation process, comprising:
        (1) a first step of heating the substrate on an electrostatic chuck at a first station in a second process chamber, and applying a vacuum thereto, the substrate is loaded onto the chuck at room temperature and the temperature is ramped to a first temperature (t1) of 250° C. to 400° C. during a first period of time wherein a substantial portion of the reference layer, free layer, and tunnel barrier crystallize to a body centered cubic (bcc) structure; and
        (2) a second step of depositing an encapsulation layer comprised of one or more dielectric layers that adjoins the MTJ sidewalls and fills the gaps between adjacent MTJ nanopillars, the second step is performed after the first step and at the first station during a second period of time at the temperature t1 while maintaining the vacuum.

2. The process flow of claim 1 wherein the encapsulation layer that adjoins the MTJ sidewalls is deposited with a physical vapor deposition process comprising RF sputtering.

3. The process flow of claim 1 wherein the second step begins at an end of the first step.

4. The process flow of claim 1 wherein the MTJ nanopillars have a critical dimension less than about 70 nm.

5. The process flow of claim 1 wherein the vacuum is less than about $1\times10^{-7}$ Torr.

6. The process flow of claim 1 wherein the encapsulation layer comprises at least two layers wherein a first layer that adjoins the MTJ sidewalls is $SiO_yN_z$, $AlO_yN_z$, $TiO_yN_z$, $SiC_yN_z$, $TaO_yN_z$, or MgO, or any combination of the aforementioned materials where $y+z>0$.

7. The process flow of claim 6 wherein the first layer comprises MgO formed within a silicon nitride matrix in which MgO is from 0.1 to 10 weight % of the first layer.

8. The process flow of claim 1 wherein the encapsulation layer comprises at least two layers wherein a first layer that adjoins the MTJ sidewalls is one or more of B, Ge, BX, or GeX where X is one of O, N, B, C, Ge, Si, Al, P, Ga, In, Tl, Mg, Hf, Zr, Nb, V, Ti, Cr, Mo, W, Sr, and Zn.

9. The process flow of claim 1 wherein the encapsulation layer comprises at least two layers wherein a first layer adjoins the MTJ sidewalls, and a second layer formed on the first layer is $SiO_yN_z$, $AlO_yN_z$, $TiO_yN_z$, $SiC_yN_z$, $TaO_yN_z$, or MgO, or any combination of the aforementioned materials where y+z>0.

10. The process flow of claim 1 wherein the substrate is a bottom electrode in a magnetic random access memory (MRAM), or spin torque MRAM.

11. A process flow for fabricating magnetic tunnel junction (MTJ) nanopillars, comprising:
  (a) providing a MTJ stack of layers on a substrate wherein the MTJ stack of layers comprises a reference layer, a free layer, and a tunnel barrier layer between the reference layer and free layer;
  (b) patterning the MTJ stack with one or both of a reactive ion etch (RIE) and an ion beam etch (IBE) to form a plurality of MTJ nanopillars each having a sidewall that extends from a top surface thereof to a top surface of the substrate, and wherein adjacent MTJ nanopillars are separated by a gap; and
  (c) performing an encapsulation process, comprising:
    (1) a first step of heating the substrate on an electrostatic chuck at a first station in an encapsulation process chamber, and applying a vacuum thereto, the substrate is loaded onto the chuck at room temperature and the temperature is ramped to a first temperature (t1) of 250° C. to 400° C. during a first period of time wherein a substantial portion of the reference layer, free layer, and tunnel barrier crystallize to a body centered cubic (bcc) structure;
    (2) a second step during a second period of time of ramping the chuck and substrate at the first station to a second temperature (t2) where t2>t1, and t2 is proximate to 400° C. but not greater than 450° C.;
    (3) a third step of depositing an encapsulation layer comprised of one or more dielectric layers that adjoins the MTJ sidewalls and fills the gaps between adjacent MTJ nanopillars, the third step is performed at the first station during a third period of time at the temperature t2 while maintaining the vacuum.

12. The process flow of claim 11 wherein the third step begins at an end of the second step.

13. The process flow of claim 11 wherein the second step begins at an end of the first step.

14. The process flow of claim 11 wherein the MTJ nanopillars have a critical dimension less than about 70 nm.

15. The process flow of claim 11 wherein the vacuum is less than about $1 \times 10^{-7}$ Torr.

16. The process flow of claim 11 wherein the encapsulation layer comprises at least two layers wherein a first layer that adjoins the MTJ sidewalls is $SiO_yN_z$, $AlO_yN_z$, $TiO_yN_z$, $SiC_yN_z$, $TaO_yN_z$, or MgO, or any combination of the aforementioned materials where y+z>0.

17. The process flow of claim 16 wherein the first layer comprises MgO that is formed within a silicon nitride matrix in which MgO is from 0.1 to 10 weight % of the first layer.

18. The process flow of claim 11 wherein the encapsulation layer comprises at least two layers wherein a first layer that adjoins the MTJ sidewalls is one or more of B, Ge, BX, or GeX where X is one of O, N, B, C, Ge, Si, Al, P, Ga, In, Tl, Mg, Hf, Zr, Nb, V, Ti, Cr, Mo, W, Sr, and Zn.

19. The process flow of claim 11 wherein the encapsulation layer comprises at least two layers wherein a first layer adjoins the MTJ sidewalls, and a second layer formed on the first layer is $SiO_yN_z$, $AlO_yN_z$, $TiO_yN_z$, $SiC_yN_z$, $TaO_yN_z$, or MgO, or any combination of the aforementioned materials where y+z>0.

20. The process flow of claim 11 wherein the substrate is a bottom electrode in a magnetic random access memory (MRAM) or spin torque MRAM.

* * * * *